(12) United States Patent
Kashani

(10) Patent No.: US 7,190,796 B1
(45) Date of Patent: Mar. 13, 2007

(54) ACTIVE FEEDBACK-CONTROLLED BASS COLORATION ABATEMENT

(75) Inventor: Ahmad Reza Kashani, Dayton, OH (US)

(73) Assignee: Design, Imaging & Control, Inc., Dayton, OH (US)

( * ) Notice: Subject to any disclaimer, the term of this patent is extended or adjusted under 35 U.S.C. 154(b) by 616 days.

(21) Appl. No.: 10/014,834

(22) Filed: Dec. 11, 2001

Related U.S. Application Data

(63) Continuation-in-part of application No. 09/991,895, filed on Nov. 6, 2001, now abandoned.

(60) Provisional application No. 60/246,253, filed on Nov. 6, 2000.

(51) Int. Cl.
*H03B 29/00* (2006.01)

(52) U.S. Cl. .................. 381/71.1; 381/71.14; 381/71.5

(58) Field of Classification Search .... 381/71.1–71.14; 700/94
See application file for complete search history.

(56) References Cited

U.S. PATENT DOCUMENTS

| | | |
|---|---|---|
| 4,689,821 A | 8/1987 | Salikuddin et al. |
| 4,876,722 A | 10/1989 | Dekker et al. |
| 5,125,241 A | 6/1992 | Nakanishi et al. |
| 5,310,137 A | 5/1994 | Yoerkie, Jr. et al. |
| 5,343,713 A | 9/1994 | Okabe et al. |
| 5,355,417 A | 10/1994 | Burdisso et al. |
| 5,373,922 A | 12/1994 | Marra |
| 5,394,478 A | 2/1995 | Hathaway et al. |
| 5,410,607 A | 4/1995 | Mason et al. |
| 5,515,444 A | 5/1996 | Burdisso et al. |
| 5,558,298 A | 9/1996 | Pla et al. |
| 5,651,072 A | 7/1997 | Nakao et al. |
| 5,666,427 A | 9/1997 | Kim et al. |

(Continued)

OTHER PUBLICATIONS

Kruger et al., Effective Noise Reduction With Hybrid Silencers, inter-noise 96, 25th Anniversary Congress—Liverpool, pp. 1097-1100.

(Continued)

*Primary Examiner*—Vivian Chin
*Assistant Examiner*—Corey Chau
(74) *Attorney, Agent, or Firm*—Dinsmore & Shohl LLP

(57) ABSTRACT

A system for actively damping the low-frequency coloration of sound in a listening room is provided comprising an acoustic wave sensor, an acoustic wave actuator, and an electronic feedback controller. The listening room defines at least one mode of low-frequency coloration. The acoustic wave actuator is substantially collocated with the acoustic wave sensor within the listening room. The electronic feedback controller is operative to generate a signal at its output by applying a feedback controller transfer function. The feedback controller transfer function comprises a second order differential equation including a first variable representing a predetermined damping ratio and a second variable representing a tuned natural frequency and creates a 90 degree phase lead substantially at the resonant frequencies of at least one mode of low-frequency coloration. The feedback controller output signal represents a rate of change of volume velocity to be produced by the acoustic wave actuator. Further provided are methods for actively damping the low-frequency coloration of sound within a listening room and systems for actively treating noise within a fluid-carrying duct, including those which employ active low- and high-pass acoustic filters.

20 Claims, 10 Drawing Sheets

U.S. PATENT DOCUMENTS

| | | | |
|---|---|---|---|
| 5,841,876 A | 11/1998 | Gifford et al. |
| 5,974,155 A | 10/1999 | Kashani et al. |
| 5,978,489 A | 11/1999 | Wan |
| 6,002,778 A | 12/1999 | Rossetti et al. |
| 6,018,689 A | 1/2000 | Kumura et al. |
| 6,031,917 A | 2/2000 | Mathur |

OTHER PUBLICATIONS

Fraunhofer Institute of Building Physics (IBP), Research Field: "Active Silencers" (visited Jun. 5, 2002) <http://www.ibp.fhg.de/rata/en/aktivl-e.html>, 3 pgs.

Platform Innovative Acoustics, Actively absorbing silencer (visited Jun. 5, 2002) <http://www.pia-alfa.de/en/schako_fly2.htm>, 2 pgs.

Schako Klima—Luft, ASDK Product Description; Ferdinand Schad Kg, Steigstr. 25-27, D-78600 Kolbingen, pp. 1002.1-1002.10.

Kashani, R. et al., "Acoustic Damping of Dodge Durango Cabin," Proceedings of the Society of Automotive Engineers (SAE) Noise and Vibration Conf. Traverse City, MI, 2001, pp. 1-6.

"4:Inspec 1983-1997/EB W1, 1997, Institution of Electrical Engineers, pp. 1-13".

"NASA—RECON Database Search Report, pp. 1-10".

340:Claims (R)/US Patents ABS 1950-1996/Nov. 1997 IFI/Plenum Data Corp., pp. 19-25.

"8:Ei; Compendex(R) 1970-1997/Mar. WZ, 1997, Engineering Info. Inc., pp. 14-18".

Clark et al., Active damping of enclosed sound fields through direct rate feedback control, J. Acoust. Soc. Am. 97(3), Mar. 1995, 1995 Acoustical Society of America, pp. 1710-1716.

Freymann, R., "Passive and Active Damping Augmentation Systems in the Fields of Structural Dynamics and Acoustics" 30th AIAA/ASME/ASCE/AHS/ASC Structures, Structural Dynamics and Materials Conference, Apr. 3-5, 1989, pp. 348-361.

Hong, J. et al., Article entitled "Modeling, Identification, and Feedback Control of Noise in an Acoustic Duct" from IEEE Transactions on Control Systems Technology, vol. 4, No. 3, May 1996, pp. 283-291.

Mode 1-0-0

Mode 0-1-0

Mode 1-1-0

Mode 1-1-1

ACTIVE FEEDBACK-CONTROLLED BASS COLORATION ABATEMENT

CROSS-REFERENCE TO RELATED APPLICATIONS

This application is a continuation-in-part of U.S. patent application Ser. No. 09/991,895, filed Nov. 6, 2001 now abandoned and claiming priority to U.S. Provisional Application Ser. No. 60/246,253, filed Nov. 6, 2000.

BACKGROUND OF THE INVENTION

The present invention relates in general to systems and methods for influencing sound within an enclosure and, more particularly, to a system and method that reduces the bass coloration of sound within a listening room by actively damping low-frequency boom noise, as well as other systems for actively damping noise within fluid-carrying ducts.

The experience of hearing sound in a specially designed listening environment, such as a listening room, concert hall, recording or sound studio, or other like enclosure, is affected almost as much by the dimensions of the enclosure itself as it is by the quality of the source. A properly designed listening environment enables the listener to clearly hear all of the sound or music generated by the source in the precise tone and manner in which it was intended.

A sound source generates waves that travel within the enclosure. Those waves, which travel directly from the source to the listener, are called the "direct sound" and take a few milliseconds to reach the listener. Shortly after the arrival of the direct sound, a series of semi-distinct reflections from various reflecting surfaces (e.g., walls and ceiling) will reach the listener. Moreover, other reflections of lower amplitude reach the listener after the early reflections. These reflections merge into what is called the "reverberant sound." "Reverberant sound" is an issue in the context of fluid-carrying ducts as well, although the primary concern in fluid carrying ducts are acoustical disturbances generated from a fluid source like a pump or fan.

Consequently, there is a need for an improved system for use in reducing reverberant sound or bass coloration within an enclosure such as a listening room, and for a method for achieving such a result. The need also remains for systems that actively treat noise within fluid-carrying ducts.

BRIEF SUMMARY OF THE INVENTION

Generally, the present invention relates to a system for improving the quality of sound within a listening room and for actively treating noise within fluid-carrying ducts.

In the context of a listening room, in order for the sound to appear clear and lifelike to the listener, an appropriate amount of "reverberation" is required. Reverberation is the gradual decay of sound within an enclosure after the source of the sound ceases to exist. It can affect the character of all sounds within an enclosure, depending upon the geometry and absorptivity thereof. While too much reverberation of sound within an enclosure can make music sound muddy or unintelligible, too little can make it sound dry or dead.

However, as a result of their size and geometry, certain rooms can accommodate excessive reverberation of sound at particular frequencies, resulting in the reinforcement and lingering of certain tones in music, after they should normally have ceased. This effect, called "coloration", is a result of standing waves or resonances (modes) within an enclosure. These are waves whose original oscillations are continuously reinforced by their own reflections. Sounds reflecting from surface to surface can interfere at certain frequencies, resulting in acoustic resonance; the intensification of sound.

Coloration can significantly affect the quality of sound or music within an enclosure. In particular, listening rooms with small dimensions exhibit severe coloration in the bass or upper low-frequency region. These smaller rooms have dimensions that favor standing waves or resonance that are directly within the fundamental range of voice and many musical instruments. In this range, the human ear is very sensitive and critical. A typical room will have many standing waves and potential colorations. Consequently, in order to create a good listening environment, the low-frequency standing waves must be damped.

The strength and character of a sound wave reflected off of a surface depends upon the absorption coefficient of that surface. Massive impermeable surfaces such as concrete have very low absorption coefficients and are regarded as practically perfect reflectors. In contrast, a thin porous material mounted against a hard backing, such as a carpeted floor, will be primarily reflective at low frequencies, but will increase in absorption efficiency with increasing frequency.

It is a common misconception in the art that using foam acoustical tiles, fiberglass, heavy drapery, thick carpets, and other absorptive materials within an enclosure can solve bass coloration problems. However, while these materials are excellent absorbers at higher frequencies, they become increasingly less effective below about 1000 Hz and totally ineffective at bass frequencies (<150 Hz). Frequently, the overuse of foam tiles or fiberglass to cure a poorly performing listening room will in fact aggravate the problem by severely reducing reverberation, which results in a very dead-sounding room with a loss of the natural clarity and sparkle of voice and instruments. Such a very dead room (a room with no reverberation) does not present a pleasant listening environment and often requires excessive amounts of equalization with the resulting sound still lacking in clarity and presence.

Because plush furniture and absorptive materials such as foam acoustic tiles and fiberglass do not solve low-frequency coloration problems within an enclosure, low-frequency absorbers are commonly employed in the art to address this issue. Low-frequency absorbers or bass traps, such as membrane absorbers and Helmholtz resonators (HRs), can be designed to dissipate the energy of offending low-frequency modes and standing waves that cause coloration. Tuning the fundamental frequency of these absorbers to the standing wave coloring the enclosure helps dissipate the energy of that standing wave while at the same time reflecting and diffusing the higher frequency modes contributing to a very natural sounding acoustical environment.

However, all bass traps, regardless of their effectiveness have two drawbacks that make them impractical for many applications. First, bass traps are very large in size. For example, the cavity volume of a typical HR is inversely proportional to the square of its tuning frequency. This makes the size of bass traps objectionably large when tuned to low frequencies. Another potential concern is that when used for adding damping to an acoustic mode, a fair amount of energy dissipation should occur in the bass trap. For example, there might not be enough friction to the flow of fluid in the neck of a typical HR for it to be used effectively in such capacity.

Finally, bass traps can only be tuned to a single frequency. When absorption at multiple frequencies is required, a number of bass traps must be employed, furthering costs and complicating the design of effective listening environments. Moreover, while the first structural mode of a membrane absorber type bass trap (commonly made of plywood or sheet rock, i.e., dry wall, mounted on 2×4 studs) is tuned to the coloring acoustic mode of the room and thus adding damping to that mode, the higher order modes of membrane vibration will couple with the acoustics of the enclosure and create their own coloration problem.

In accordance with one embodiment of the present invention a system for actively damping the low-frequency coloration of sound is provided comprising a listening room, an acoustic wave sensor, an acoustic wave actuator, and an electronic feedback controller. In accordance with another embodiment of the present invention, a method for actively damping the low-frequency coloration of sound within a listening room defining at least one mode of low-frequency coloration is provided. In accordance with yet another embodiment of the present invention, a system for actively damping noise within a fluid-carrying duct is provided comprising a fluid-carrying duct, an acoustic wave sensor, an acoustic wave actuator, and an electronic feedback controller. In accordance with yet another embodiment of the present invention, a feedback controller transfer function can be arranged to simulate active, low- and high-pass acoustic filters. In accordance with a further embodiment of the present invention, the feedback controller may be configured to target selectively one or more disturbance or coloration frequencies.

It is important to note that, in each of the applications of the various embodiments of the present invention, a single electronic feedback controller may be programmed to damp or treat one or more frequencies with no need for additional hardware. The frequency or frequencies may be targeted in the control software itself or may be targeted through real-time selection or input via a user interface.

Accordingly, it is an object of the present invention to provide a system and method that effectively reduces the low-frequency coloration of sound within a listening room, particularly a listening room where the coloration generated within the listening room is dominated by at least one mode of low-frequency coloration. It is a further object of the present invention to provide a system for actively treating noise within fluid-carrying ducts. Other objects of the present invention will be apparent in light of the description of the invention embodied herein.

DETAILED DESCRIPTION OF THE INVENTION

Figure 1:
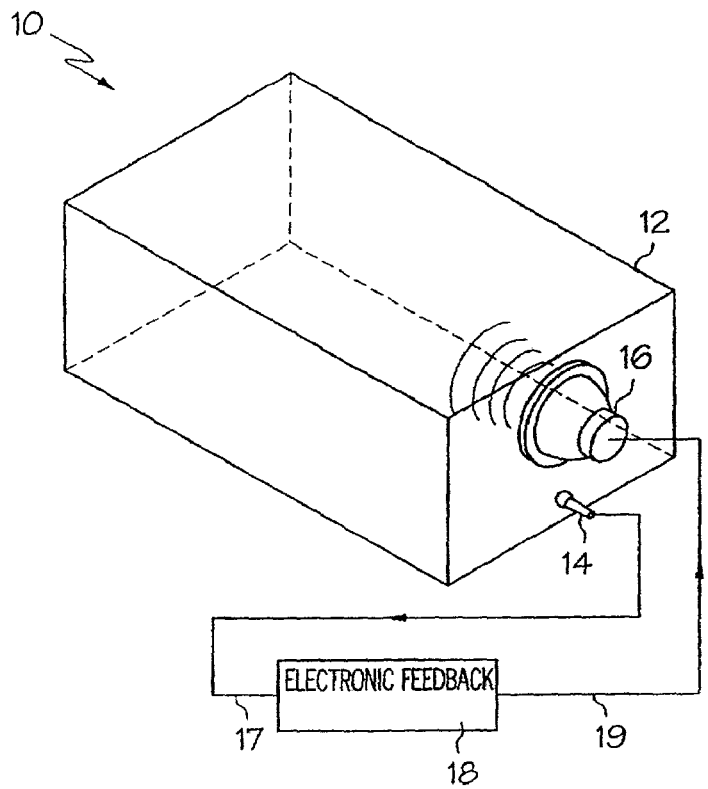
FIG. 1 is a general schematic illustration of a system for actively damping the low-frequency coloration of sound within a listening room according to the present invention.

Referring initially to FIG. 1, a system for actively damping the low-frequency coloration of sound 10 according to the present invention is illustrated in general schematic form. The system 10 employs a feedback control scheme for reducing the boominess of sound at frequencies corresponding to offending (coloring) standing waves within a listening room. The system comprises a listening room 12, an acoustic wave sensor 14, an acoustic wave actuator 16, and an electronic feedback controller 18. As will be appreciated by those skilled in the art of acoustics, the listening room 12 defines at least one mode of low-frequency coloration. For the purposes of defining and describing the present invention, it should be understood that a listening room typically comprises any completely bounded three dimensional space, but may also comprise a three dimensional space including some relatively insubstantial unbounded portions, which is used for listening to music and/or other sounds, or for recording and/or broadcasting music and/or sounds such as a recording, broadcasting, or sound studio.

Each listening room produces a complex set of standing waves, whose natural frequencies are determined by the room dimensions. The determination of these standing wave frequencies and shapes, and the proper measures to effectively eliminate them, involves mathematical modeling of the room. Wave propagation is commonly used to study and design the low-frequency acoustics of enclosures such as a listening room or a small recording/broadcasting studio. This method is based on the motion of waves within a three-dimensional bounded space.

From the wave acoustic viewpoint, a room may be treated as a complex resonator having numerous acoustic modes at different resonant frequencies. Rooms with parallel wall geometry can be modeled analytically. Finite element methods are typically used to model rooms exhibiting more complex geometry, e.g., rooms with unparallel walls or curved boundaries.

The resonant frequencies and the corresponding mode shapes of standing waves within a room depend primarily on the shape and size of the room, whereas their damping depend primarily on the boundary conditions. Damping may depend on either acoustic impedance or the absorption at the walls. Stiff walls keep more energy in the room and make the distribution of energy in the modal range much less even, with the modal peaks being more distinct.

Figure 2A:
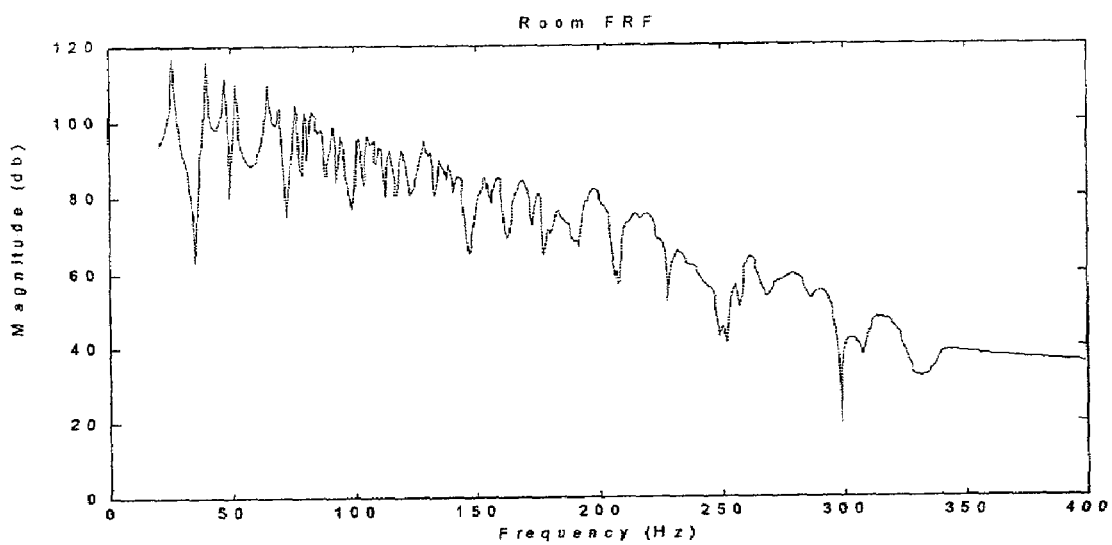
FIGS. 2(*a*) and 2(*b*) are plots of the acoustic frequency response of a rectangular room at 20–400 Hz and at 20–100 Hz respectively.
Figure 2B:
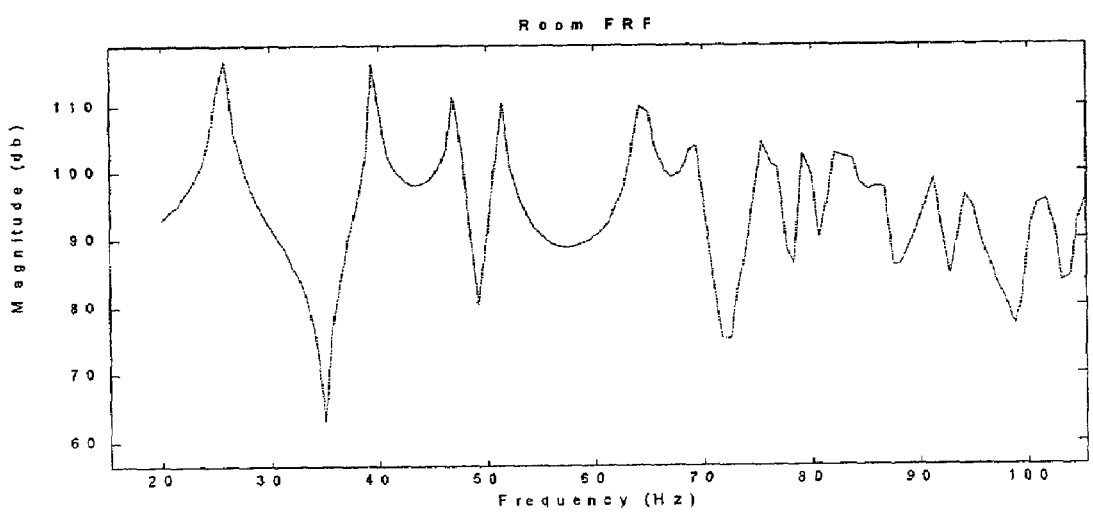

For purposes of further defining and describing the present invention, the transmission of sound from an acoustic wave actuator (i.e., a subwoofer capable of generating low-frequency sound) located in one corner of a 13×20×8 ft rectangular room to an acoustic wave sensor such as a microphone located in a diagonally opposite corner over the frequency range of 20–400 Hz is depicted in FIG. 2(a). The 20–100 Hz range of this frequency response is magnified and shown in FIG. 2(b). These figures illustrate the marked influence a room has on sound transmission, especially at very low frequencies. Consequently, the performance of acoustic wave actuators, such as subwoofers, are dominated by the room. As illustrated by FIGS. 2(a) and 2(b), most of the bass acoustic energy is in the first mode (or first few modes). This is why bass is typically flabby or boomy with "one-tone" quality in untreated listening rooms. Even explosions in an action movie sound fake and tonal in such rooms.

Table 1 below shows the resonant frequencies below 100 Hz for a 13×20×8 ft rectangular room. The corresponding modes are either numbered consecutively in the order of increase in frequency or indexed using three integers indicating the number of cycles of the standing wave formed in length, width, and height directions (x, y, and z) of the rectangular room. For example, mode number 6, corresponding to the resonant frequency of 64.9 Hz, has the mode index of 2,1,0, which signifies the number of standing waves along the three x, y, z directions of the room (2 cycles of a standing wave along x, one along y, and none along z directions).

TABLE 1

Natural Frequencies Below 100 Hz for a 13 × 20 × 8 ft Enclosure

| Mode # | nx, ny, nz | f, Hz |
| --- | --- | --- |
| 1 | 1, 0, 0 | 25.72 |
| 2 | 0, 1, 0 | 39.58 |
| 3 | 1, 1, 0 | 47.20 |
| 4 | 2, 0, 0, | 51.45 |
| 5 | 0, 0, 1 | 64.31 |
| 6 | 2, 1, 0 | 64.91 |
| 7 | 1, 0, 1 | 69.27 |
| 8 | 0, 1, 1 | 75.51 |
| 9 | 3, 0, 0 | 77.17 |
| 10 | 0, 2, 0 | 79.15 |
| 11 | 1, 1, 1, | 79.78 |
| 12 | 2, 0, 1 | 82.36 |
| 13 | 1, 2, 0 | 83.23 |
| 14 | 3, 1, 0 | 86.73 |
| 15 | 2, 1, 1 | 91.38 |
| 16 | 2, 2, 0 | 94.41 |
| 17 | 3, 0, 1 | 100.46 |

Figure 3:
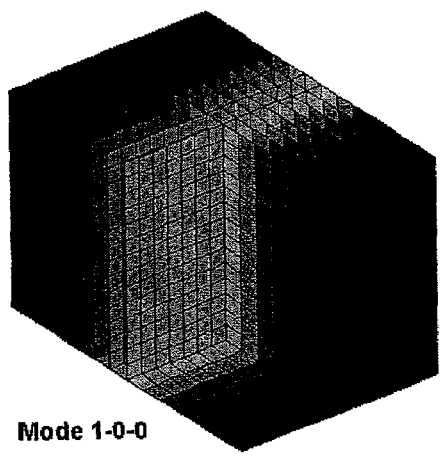
FIG. 3 illustrates different acoustic modes of a rectangular room. Lowest (negative) and highest (positive) pressures are signified by dark and light shades, respectively.
Figure 3:
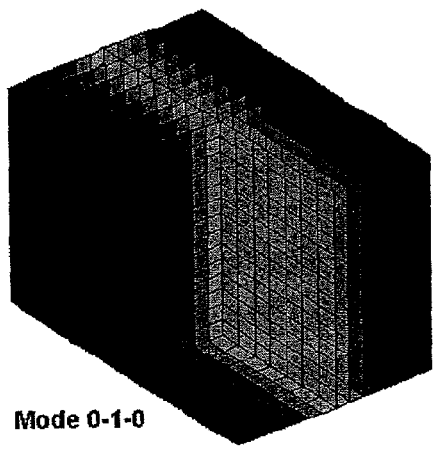
Figure 3:
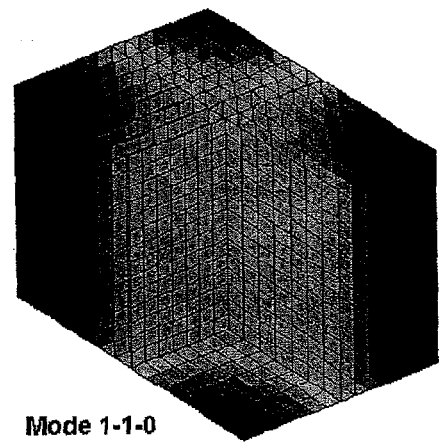
Figure 3:
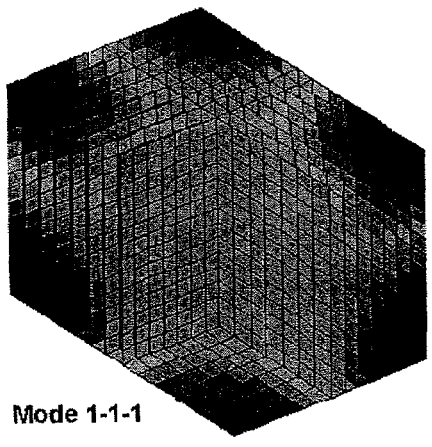

FIG. 3 illustrates mode shapes depicting the modal patterns of some of the standing waves of the 13×20×8 ft room. Each mode shape indicates how tones at their corresponding frequencies will be heard in the room. For example, mode #1 (indexed 1,0,0) is a one dimensional, 25.7 Hz (see Table 1 above) standing wave formed along the length of the room. Any tone at 25.7 Hz or its close vicinity will be heard the loudest close to the facing walls and the lowest at the middle of the room along its length. Mode #3 (indexed 1,1,0) in contrast is a two dimensional standing wave with the frequency 47.2 Hz. Tones at this frequency or close to it will be heard the loudest at the corners of the room and the lowest at the center of the room.

Standing waves occur at high frequencies too. However, due to the short wavelength of sound at higher frequencies the modal density (the number of modes in a frequency interval) at these frequencies is by far higher than that at low frequencies. For example, there are as many modes in the 25–76 Hz frequency range of Table 1 above as the number of modes in the 76–99 Hz range. Higher modal density along with the high absorption effectiveness of the furniture, walls, and other absorptive material in the room make the variation in sound intensity at different frequencies (sound coloration) less noticeable at higher frequencies (see FIG. 2(a)).

Figure 4:
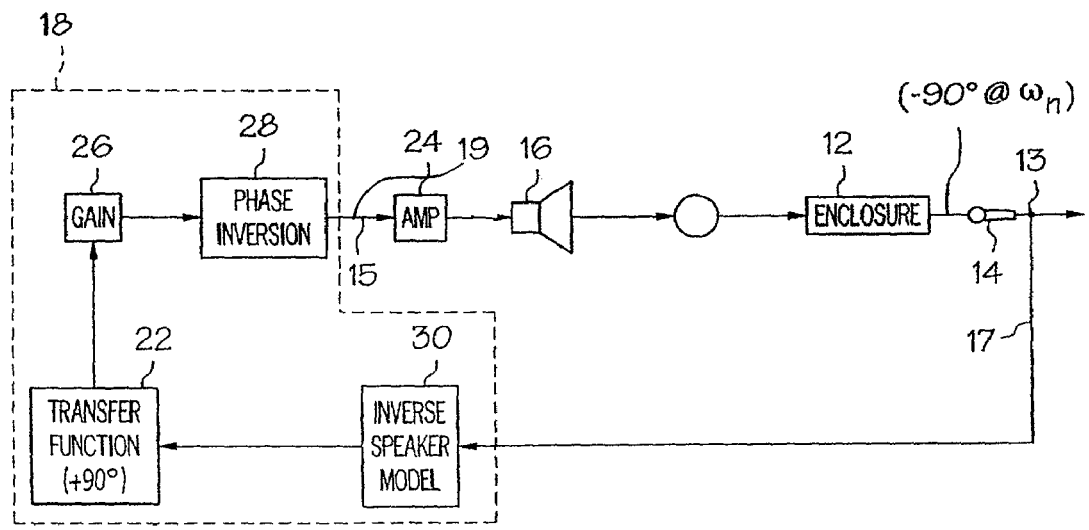
FIG. 4 is a detailed schematic block diagram of a system for actively damping the low-frequency coloration of sound within a listening room according to the present invention.

The acoustic wave sensor 14 is positioned within the listening room 12 and is operative to produce a first signal 13 representative of the at least one mode of low-frequency coloration, see FIG. 4. Specifically, the acoustic wave sensor 14 can be a microphone which produces an electrical signal indicative of the pressure of the sound waves generated by the source within the listening room 12. The acoustic wave actuator 16 is also positioned within the listening room 12 and is responsive to a driving signal, hereinafter referred to as a second signal 15, see FIG. 4. Specifically, the second signal 15 can be an electric signal which represents a rate of change of volume velocity to be produced by the acoustic wave actuator 16, which is preferably substantially collocated with the acoustic wave sensor 14 to optimize damping of the at least one mode of low-frequency coloration according to the present invention. The acoustic wave actuator 16 can be a subwoofer.

For the purposes of further defining and describing the present invention, it should be understood that a substantially collocated arrangement includes any arrangement where the acoustic wave actuator 16 and the acoustic wave sensor 14 are positioned close enough to each other to ensure that the differences in the respective phases is negligible. Specifically, the actuator and the sensor are positioned such that the respective angles of the mode of low-frequency coloration and the sound generated by the acoustic wave actuator 16 at the natural frequency of the target acoustic mode within the listening room 12 results in a negligible difference in phase. For example, the acoustic wave actuator 16 and the acoustic wave sensor 14 are substantially collocated relative to each other when they are positioned directly adjacent to each other, as illustrated in FIG. 1. The general position of the collocated sensor 14 and actuator 16 within the listening room 12 may be as indicated in FIG. 1, but is typically selected to correspond to the location of an acoustic anti-node of a target mode within the listening room 12. The location of the anti-node may be determined by measuring pressure at a target frequency at various locations within the listening room 12 or through construction of an acoustic model of the listening room 12. It is noted that collocation becomes more difficult as the frequency of coloration approaches about 500 Hz and is generally fairly practical to achieve at frequencies in the vicinity of about 150 Hz.

Referring now to FIGS. 1 and 4, the electronic feedback controller 18 defines an input 17 coupled to the first signal 13 and an output 19. The electronic feedback controller 18 is operative to generate the second signal 15 at the output 19 by applying a feedback controller transfer function 22 to the first signal 13.

The feedback controller transfer function 22 of the present invention comprises a second order differential equation including a first variable ξ representing a predetermined damping ratio and a second variable representing a tuned natural frequency $\omega_n$. The electronic feedback controller 18 may comprise an acoustic damping controller that is tailored after the dynamics of a Helmholtz resonator and can be tuned such that its natural frequency matches the resonant frequency of the listening room 12 which is targeted for damping. The acoustic damping controller can be programmed to apply the feedback controller transfer function 22, and the other functions associated with the electronic feedback controller 18 described herein. Alternatively, the feedback controller 18 may comprise conventional solid state electronic devices operative to apply the functions associated with the feedback controller 18.

The first variable ξ and the second variable $\omega_n$ are selected to damp the at least one mode of low-frequency coloration. Specifically, the first variable ξ representing the predetermined damping ratio is a value between about 0.1 and about 0.35. The second variable $\omega_n$ representing the tuned natural frequency is selected to be substantially equivalent to the at least one mode of low-frequency coloration. Typically, the target acoustic mode comprises the lowest audible frequency mode of the at least one mode of low-frequency coloration. It is contemplated by the present invention that, the second variable $\omega_n$ representing the tuned natural frequency may be selected to be offset from the target acoustic mode so as to be positioned between the characteristic frequencies of two adjacent modes. In this manner, the magnitude of a plurality of adjacent acoustic modes may be damped.

Figure 5:
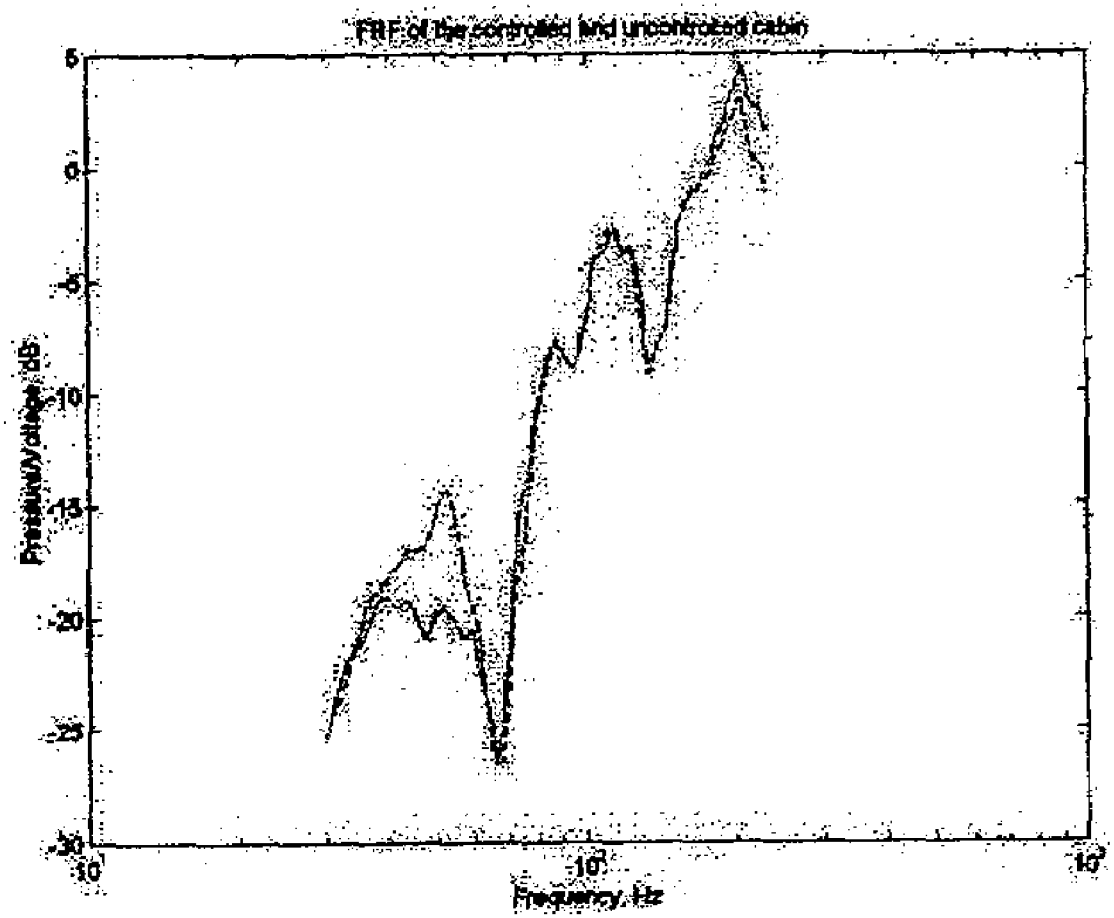
FIG. 5 is a plot of the frequency response functions of a small room with the acoustic damping controller of the present invention on and off.
Figure 6:
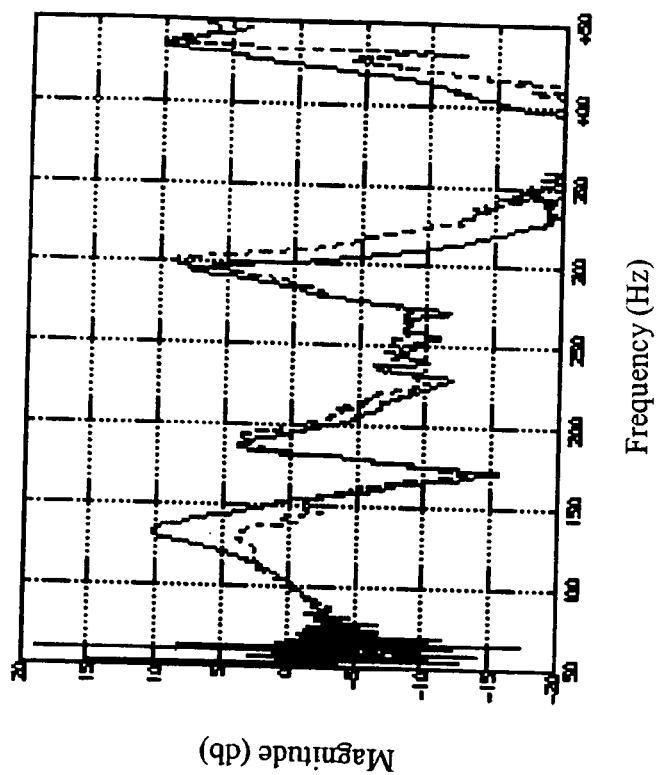
FIG. 6 is a plot of the frequency response functions of an enclosure, which was measured at two different locations, with and without the system for actively damping the low-frequency coloration of sound of the present invention.
Figure 6:
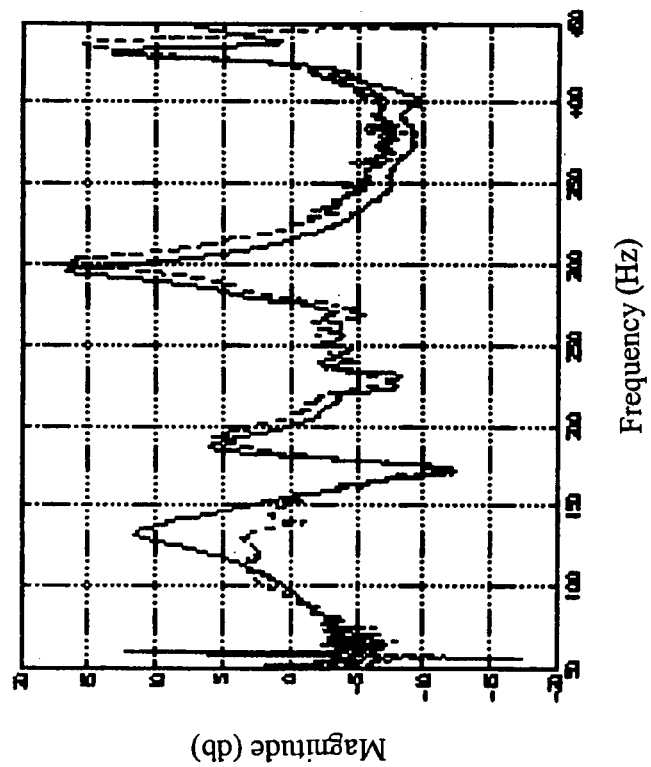

The frequency response functions of an enclosure controlled by a first transfer function 22 according to the present invention is illustrated in FIGS. 5 and 6. The feedback controller transfer function (Equation (1)) of FIGS. 5 and 6 is a follows:

$$\frac{V(s)}{P(s)} = G \frac{s^2}{s^2 + 2\xi\omega_n s + \omega_n^2} \quad (1)$$

where V(s) corresponds to the rate of change of volume velocity, P(s) corresponds to the pressure at the location of the acoustic wave sensor and the acoustic wave actuator, s is the Laplace variable, ξ is a damping ratio, $\omega_n$ is the tuned natural frequency, and G is a gain value. The transfer function of Equation (1) is derived from a model of a Helmholtz resonator attached to the listening room 12 and maps the pressure in the listening room where the actuator 16 and sensor 14 are collocated to the rate of change of volume velocity generated by the acoustic wave actuator 16.

Further, a second transfer function according to the present invention is provided. This second feedback controller transfer function (Equation (2)) is as follows:

$$\frac{V(s)}{P(s)} = G \frac{s}{s^2 + 2\xi\omega_n s + \omega_n^2} \quad (2)$$

were the units of V(s) corresponds to the rate of change of volume velocity, P(s) corresponds to the pressure at the location of the acoustic wave sensor and the acoustic wave actuator, s is the Laplace variable, ξ is a damping ratio, $\omega_n$ is the tuned natural frequency, and G is a negative gain value. The transfer function of Equation (2) is derived from the positive position feedback active dampening mechanism utilized for structural damping.

Further still, a third transfer function according to the present invention is provided. This third feedback controller transfer function (Equation (3)) is as follows:

$$\frac{V(s)}{P(s)} = G \frac{s(s+a)}{s^2 + 2\xi\omega_n s + \omega_n^2} \quad (3)$$

were the units of V(s) corresponds to the rate of change of volume velocity, P(s) corresponds to the pressure at the location of the acoustic wave sensor and the acoustic wave actuator, s is the Laplace variable, a represents a weighting factor, ξ is a damping ratio, $\omega_n$ is the tuned natural frequency, and G is a gain value. The transfer function of Equation (3) is derived from a combined positive pressure feedback controller weighted by the weighting coefficient α (see Equation (2)) and a Helmholtz resonator-based controller (see Equation (1)).

It is noted that the power amplification factor 24 and the gain value 26, see FIG. 4, are dependent upon the particular specifications of the room geometry, the acoustic wave sensor 14 and the acoustic wave actuator 16, and upon the amplitude of the at least one mode of low-frequency coloration, and are subject to the selection and optimization by those practicing the present invention.

Each of the previously described feedback controller transfer functions defines a frequency response having a characteristic maximum gain $G_{MAX}$ substantially corresponding to the value of the tuned natural frequency $\omega_n$. The gain increases substantially uniformly from a minimum frequency value to an intermediate frequency value to define the characteristic maximum gain $G_{MAX}$ and decreases from the maximum gain $G_{MAX}$ substantially uniformly from the intermediate frequency value to a maximum frequency value. For purposes of describing and defining the present invention it is noted that a substantially uniform increase comprises an increase that is not interrupted by any temporary decreases. Similarly, a substantially uniform decrease comprises a decrease that is not interrupted by any temporary increases. A substantially uniform increase or decrease may be characterized by changes in the rate of increase or decrease.

To further optimize active damping low-frequency coloration of sound according to the present invention, the feedback controller transfer functions described above create +90° phase shifts substantially at the tuned natural frequency $\omega_n$. This 90° phase lead is indicated in the transfer function block 22 of FIG. 4 and counters a 90° phase lag of the listening room 12 at a frequency corresponding to the tuned natural frequency $\omega_n$.

A phase inversion 28 is introduced in the feedback controller 18 to invert the phase of the transfer function output signal 23 and ensure that the control action generated by the acoustic actuator 16 opposes the phase created by the source within the listening room 12 at the target frequency. As will be appreciated by those practicing the present invention, acoustic damping will be optimized where the acoustic wave from the actuator 16 is 180° out of phase with the acoustic disturbance at the tuned natural frequency $\omega_n$.

Acoustic wave actuators are electromechanical devices with dominant $2^{nd}$ order mechanical dynamics at low frequencies. The low-frequency transfer function of an acoustic wave actuator mapping the input voltage to the rate of change of volume velocity is similar in structure with that of the feedback controller transfer function 22 of the present invention, but not in regards to parameters. To minimize the adverse effects of the dynamics of the acoustic wave actuator 16 on the effectiveness of the feedback control scheme of the present invention, an inverse speaker model 30 is utilized in the electronic feedback controller 18 to compensate for the acoustic dynamics introduced into the system 10 by the acoustic wave actuator 16. As part of this compensation, the inverse speaker model 30 is configured to cancel the dynamics of the acoustic wave actuator 16. This will result in augmentation of the feedback controller transfer function 22 by the inverse of the acoustic wave actuator function. The resultant transfer function is as follows:

$$\frac{V(s)}{P(s)} = G \frac{s^2 + 2\zeta_s \omega_s s + \omega_s^2}{s^2 + 2\zeta \omega_n s + \omega_n^2} \qquad (3')$$

where s is the Laplace variable, $\zeta$ represents the damping ratio of the controller, $\zeta_s$ represents the damping ratio of the acoustic actuator, $\omega_n$ is the tuned natural frequency and $\omega_s$ is the natural frequency of the speaker, and G is a gain value.

In order that the invention may be more readily understood, reference is made to the following example, which is intended to illustrate the invention, but not to limit the scope thereof. The present invention is demonstrated by installing the acoustic damping controller and acoustic wave actuator in a small enclosure, such as a room, and reducing the coloration of sound corresponding to the first standing wave in the room. FIG. 5 shows the frequency response of the room acoustics with the acoustic damping controller on and off. Frequency response functions with the controller on are illustrated in FIG. 5 by a solid line, while those with the controller off are illustrated by way of a dashed line. As is further illustrated in FIG. 5, the acoustic damping controller, which was tuned to the frequency of the first standing wave, has effectively reduced the coloration due to that mode.

The acoustic damping controller can be tuned to standing waves other than the standing wave at the lowest frequency mode of coloration, or even to more than one mode of coloration. The controller may further be programmed to damp or treat selectively any one of a number of low frequencies.

FIG. 6 depicts the frequency response functions of a rectangular acoustic enclosure, measured at two different locations, with and without the system for actively damping the low-frequency coloration of sound of the present invention. The acoustic damping controller, which is tuned to add damping to the first acoustic mode of the enclosure, is performing effectively. As is illustrated in FIG. 6, a considerable amount of damping is added to that mode.

Accordingly, the low-frequency coloration of sound within a listening room 12 is significantly damped, according to the present invention, by positioning the acoustic wave sensor 14 within the listening room 12, positioning the acoustic wave actuator 16 within the listening room 12, substantially collocating the acoustic wave sensor 14 with the acoustic wave actuator 16, and coupling the input 17 of the electronic feedback controller 18 to the signal generated by the acoustic wave sensor 14. The electronic feedback controller 18 applies a feedback controller transfer function 22 to the input signal and generates an output signal which is coupled to the acoustic wave actuator 16. The feedback controller transfer function 22 comprises a second order differential equation including the first variable $\xi$ representing a predetermined damping ratio and the second variable $\omega_n$ representing a tuned natural frequency. Values for the first variable $\xi$ and the second variable $\omega_n$ are selected to optimize damping of the at least one mode of low-frequency coloration.

Figure 7:
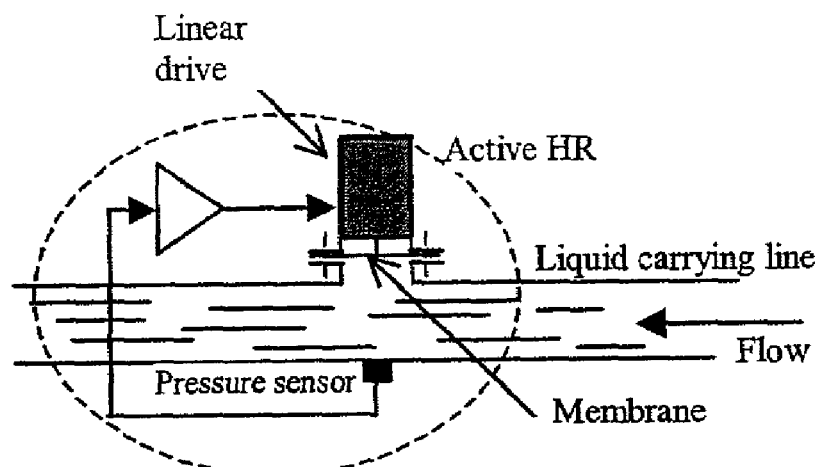
FIG. 7 is a schematic illustration of the system for actively treating noise of the present invention mounted on a liquid-carrying duct.
Figure 8:
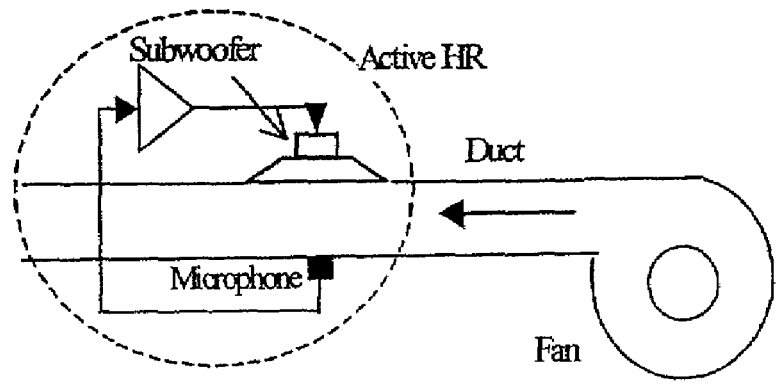
FIG. 8 is a schematic illustration of the system for actively treating noise of the present invention mounted on an air/gas-carrying duct.

In addition, a system for actively treating low-frequency noise within a fluid-carrying duct according to another embodiment of the present invention is illustrated in FIGS. 7 and 8. The system comprises a fluid-carrying duct, an acoustic wave sensor, an acoustic wave actuator, and an electronic feedback controller. As will be appreciated by those skilled in the art of acoustics, this embodiment of the present invention can be utilized in acoustic applications where traditional tuned silencers such as Helmholtz resonators are used. These include, but are not limited to, tuning of acoustic systems such as engine intake and exhaust, mufflers/silencers in ducts such as air conditioning ducts and industrial exhaust stacks, pulsation abatement in liquid-carrying lines, recording rooms and other enclosed spaces, abating fan noise, among others.

Fans moving air or another gas generate disturbances through the combination of broadband noise and strong tones at the fan's blade-passage frequency and associated harmonics. For example, in industrial exhaust applications a fan might have 12 blades and rotate at 600 rpm resulting in fundamental tone of 120 Hz. By lining the inside of a fluid-carrying duct with absorptive material broadband sound can be attenuated but not the low-frequency tone(s). This results to the transmission of low-frequency sound which will be perceived as a "rumble."

The fluid-carrying duct can be a liquid-carrying line or pipe, a gas-carrying duct, or a combination thereof. One embodiment of the present invention is directed at treating a disturbance frequency within the duct to reduce the noise attributable thereto. Modes of coloration within the duct may also be treated. An acoustic wave sensor is positioned to sense the pressure of the fluid within the duct and is operative to produce a first signal representative of the disturbance and/or the mode of coloration. Specifically, the acoustic wave sensor can be a microphone or a pressure sensor. An acoustic wave actuator is positioned to manipulate the fluid within the duct and is substantially collocated with the acoustic wave sensor. Specifically, the acoustic wave actuator can be a subwoofer or a diaphragm modulated by an electrical or hydraulic drive. An electronic feedback controller defining an input coupled to the first signal and an output is operative to generate the second signal at the output by applying the feedback controller transfer function to the first signal.

The feedback controller transfer function comprises a second order differential equation including a first variable representing a predetermined damping/treating ratio and a second variable representing a tuned natural frequency. The second variable representing the tuned natural frequency is selected to be tuned to the disturbance and/or the mode of coloration. The feedback controller transfer function defines a frequency response having a characteristic maximum gain substantially corresponding to the value of the tuned natural frequency. The feedback controller transfer function creates a substantially zero degree phase at the frequency of the disturbance and a substantially 90 degree phase lead at the mode of coloration. The phase inversion 28 of the feedback controller shifts the zero degree phase shift to a 180° phase shift.

Depending on the application, the present embodiment may employ a long-throw bass speaker (subwoofer) or a piston/diaphragm manipulated by a linear actuator, in place of a traditional silencer. Through proper actuation of the speaker/piston via a feedback controller, the device is made to modulate the fluid, which is similar to that of a Helmholtz resonator had it been installed at the same location. Due to the full controllability of the speaker/piston, the "active feedback-controlled silencer" (AFCS) of this embodiment of the present invention can be made to behave either as a dynamic absorber or a tuned damper. Due to the absence of the neck and cavity, the size of the AFCS is smaller than traditional low-frequency Helmholtz resonators. Practically, it has the same size as that of the driver (actuator).

Figures 9A, 9B, 9C:
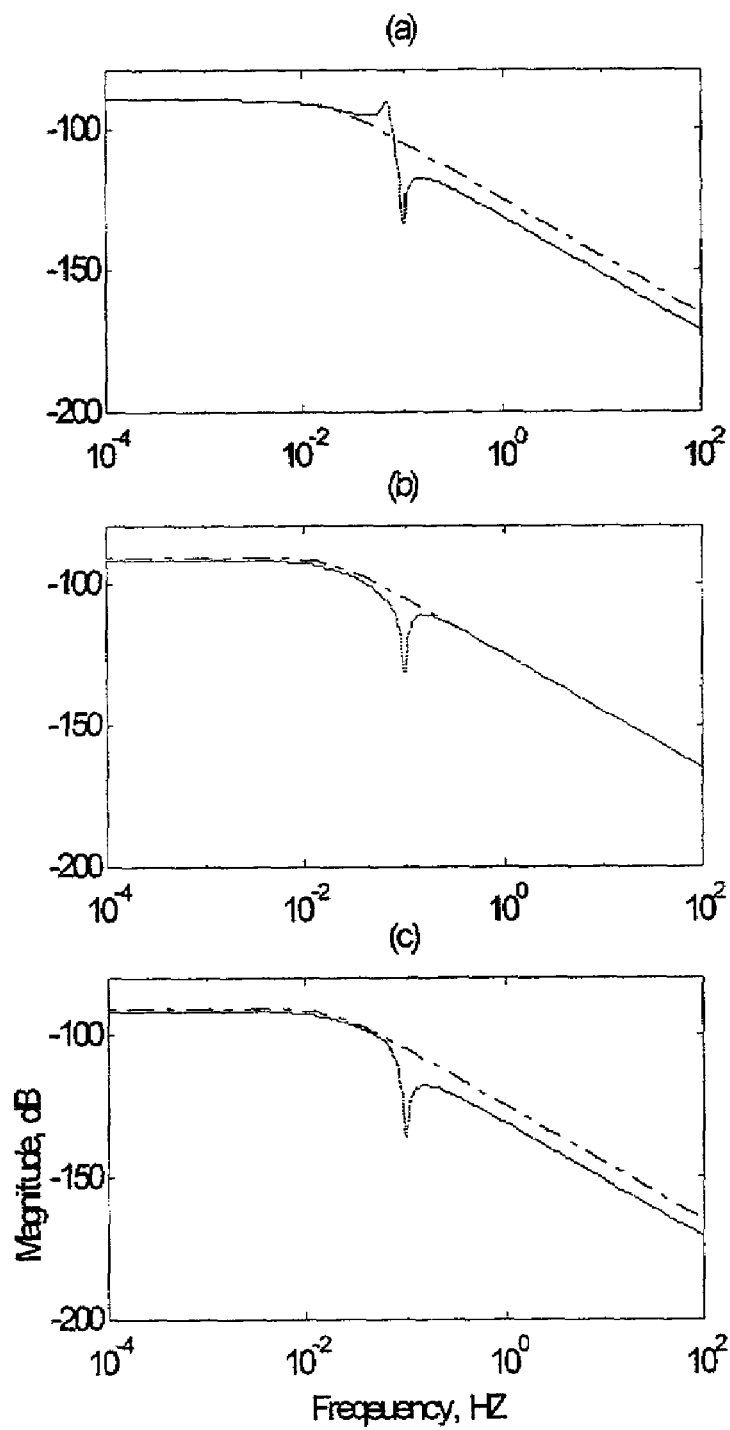
FIGS. 9(*a*)–9(*c*) is a plot of the frequency response functions of a line without (dashed) and with (solid) the system for actively treating noise within a fluid-carrying duct of the present invention.

FIG. 9 depicts the simulation frequency response functions of a stock-line (a pulp-carrying pipe) in a paper mill without (dashed) and with (solid) the AFCS, using the Helmholtz resonator (HR)-based (FIG. 9(a)), positive pressure feedback (PPF) (FIG. 9(b)), and combined PPF-HR cascaded in parallel (FIG. 9(c)) feedback controller transfer functions (Equations 1–3). In this application, the AFCS which is comprised of a membrane (or piston) actuated by a pneumatic cylinder (or any other large stroke linear actuator) and a pressure sensor collocated (or nearly collocated) with the membrane acts as a dynamic absorber reducing the undesirable effects of a 0.1 Hz pressure pulsation produced by the motion of an upstream screen. A passive silencer tuned to such a low frequency would have been unacceptably large.

Evident from FIGS. 9(a)–9(c), all of these compensators perform well at their tuned frequency, i.e., 0.1 Hz. Moreover, they all have more or less the same DC (zero frequency) performance and do not interfere with the DC part of the flow. In addition to abating the flow pulsation at the tuned frequency, the compensator tailored after the dynamics of the Helmholtz resonator of FIG. 9(a), also attenuates the high-frequency oscillations which is viewed as a desirable attribute for this controller. The disadvantage of this compensator is that it might amplify the oscillation in a narrow band just below 0.1 Hz (below the tuned frequency); see FIG. 9(a). This undesirable amplification is also present when a traditional, passive Helmholtz resonator is used for flow pulsation attenuation. The PPF controller of FIG. 9(b) does not exhibit the very low-frequency amplification of the HR controller, but it does not attenuate the high-frequency oscillations either. The third controller of FIG. 9(c) has the advantage of high-frequency pulsation attenuation of the HR controller without its disadvantage of very low-frequency, narrow band, pulsation amplification. In other words, it has the good attributes of both HR and PPF controllers.

Figure 10:
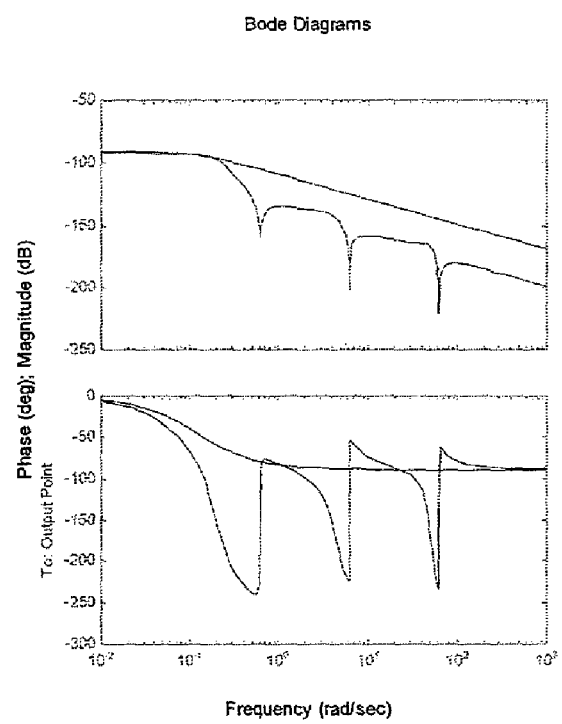
FIG. 10 is a plot of the frequency response functions of a line, subject to multiple frequency pulsation, without (dashed) and with (solid) the system for actively treating noise within a fluid-carrying duct of the present invention.

On occasions, pressure pulsation occurs at multiple frequencies. Traditional pulsation abatement techniques require multiple silencers each tuned to one of the pulsation frequencies. A single AFCS can be programmed to quiet multiple frequency pulsations with no need for additional hardware. FIG. 10 shows simulation of the frequency response functions of the stockline subject to pressure pulsations occurring at three frequencies, a decade apart from each other, starting at 0.1 Hz (0.61 rad/sec). One AFCS is used to control the line. Clear from FIG. 10, the controller is doing an effective job abating this multiple frequency pulsation. Indeed, the controller may be programmed to treat disturbances or colorations at one or more of a number of frequencies on a selective basis.

FIG. 7 depicts the schematic of the AFCS installed on a liquid-carrying line. The same strategy can be used to abate the low-frequency fan-induced noise in air/gas-carrying ducts (see FIG. 8). A subwoofer or a properly designed diaphragm modulated by an electrical or hydraulic drive will serve as the actuator of the AFCS (acting as a dynamic absorber).

In addition to being tunable, AFCS built around the proposed control technology are highly reliable, robust, cost-effective, and small in size. The compensators controlling these active devices are built in either low-cost microcontrollers/digital signal processors or op-amp electronic circuits.

In an experimental set up similar to FIG. 8, a duct with the diameter of 4 inches and the length of 8 ft is driven by a centrifugal fan with the blade passage frequency of around 770 Hz. The proposed active feedback control system is used to 1) absorb, abate, or treat the noise generated by the fan at its blade passage frequency and 2) add damping to, or treat, the 820 Hz standing wave of the tube.

Figure 11:
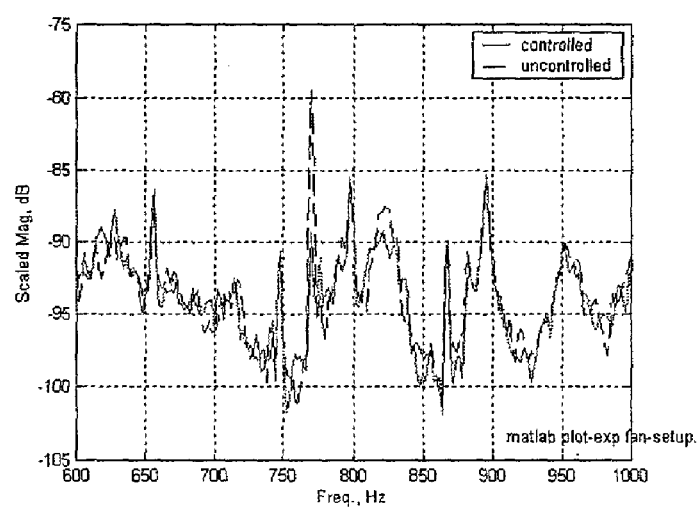
FIG. 11 is a plot of the power spectrum of the outlet pressure without (dashed) and with (solid) the system for actively treating noise within a fluid-carrying duct of the present invention.

FIG. 11 shows the power spectrum of pressure measured by a microphone located at the end of a tube. For the clarity of FIG. 11, the frequency range of 600–1000 Hz is examined. The dashed line depicts the spectrum with the controller off and the solid line shows the spectrum with controller on. It is clear from FIG. 11 that the control strategy effectively abates the pulsation occurring at the blade passage frequency without spilling energy over to other frequencies. Moreover, it treats, or adds damping to, the 820 Hz standing wave.

The active feedback-controlled scheme of the present invention resembles a band-reject acoustic filter. In fact, a Helmholtz resonator, after which the dynamics of the controller of the present invention is tailored, is viewed by acousticians as a passive, band-reject, acoustic filter. In addition to band-reject, two other acoustic filters, namely high- and low-pass, are used widely in a number of sound control applications, particularly the ones in which sound propagates in one dimension (such as ports and mufflers in ducts and exhaust systems).

Optionally, the feedback control scheme of the present invention can be used to realize active, high- and low-pass acoustic filters. In addition to having similar control algorithms (controller transfer functions), the hardware requirements of active, feedback controlled, acoustic low- and high-pass filters are similar to those of active, feedback controlled, band-reject filters. That is, they require a speaker as an actuator, and a microphone nearly collocated with the speaker, as the sensor. What distinguishes these controllers from each other is the choice of the parameters in their transfer functions.

Figure 12:
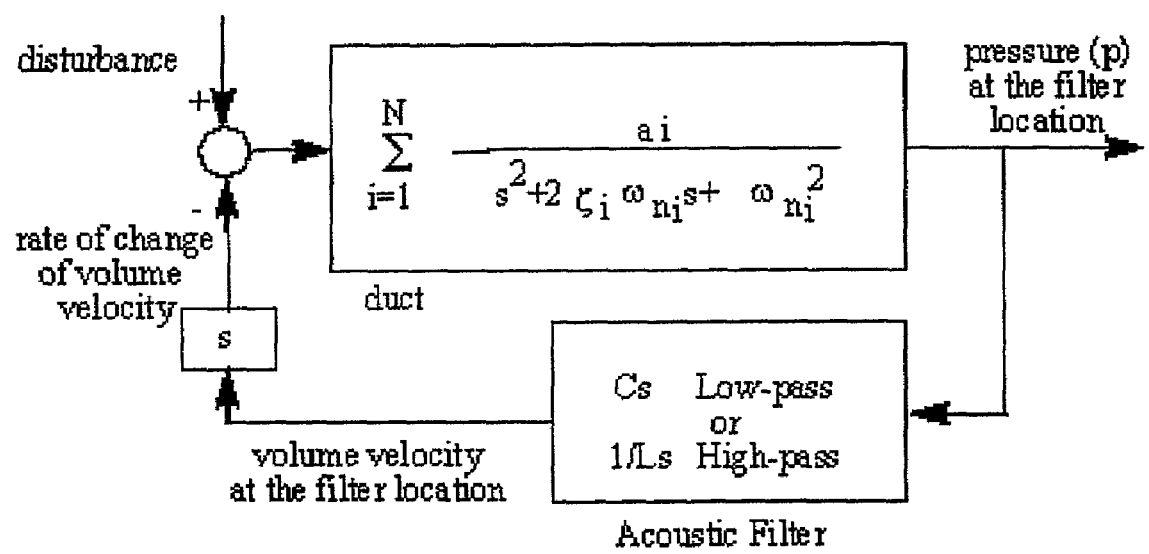
FIG. 12 is a block diagram of a duct equipped with an active, acoustic filter of the present invention.

In this embodiment of the present invention, the feedback controller transfer function can be arranged to simulate active, low- and high-pass acoustic filters in a system for actively treating noise within a fluid-carrying duct. The interaction of a muffler (a low-pass acoustic filter) and a port (a high-pass acoustic filter) with a duct is illustrated in FIG. 12. The transfer functions (or the inverse of impedance better known as admittance in the acoustics literature) of the these filters mapping the acoustic medium's pressure to the flow rate (resembling the volume velocity) at the location where they are installed are shown in the "Acoustic Filter" block of FIG. 12. As required by the wave equation formulation, the input to the duct is the rate of change of volume velocity. The s block in FIG. 12 provides the necessary differentiation to convert volume velocity to the rate of change of volume velocity.

The block diagram of FIG. 12 clearly shows the feedback nature of the interaction between low- and high-pass acoustic filters with the acoustic system (the fluid-carrying duct). This indicates that a feedback controller having the same dynamics as that of a muffler or a port can be used to actuate a loudspeaker in an active manner. Actuation of the speaker via this feedback controller perturbs the medium the same way as a low- or high-pass acoustic filter would have, had it (the acoustic filter) been installed at the same location as the speaker.

The adaptability and small size of high- and low-pass filters make the active realization of acoustic filters very attractive. Moreover, filter-specific issues such as leakage of medium through high-pass filters and coloration of passed frequencies by low-pass filters can be avoided in active filters.

Augmenting the differentiation block s with the acoustic filter block in FIG. 12 results in the following transfer functions of Equations (4) and (5) for low-pass (LP) and high-pass (HP) filters.

$$LP = Cs^2 \qquad (4)$$

$$HP = 1/L \qquad (5)$$

where C represents the compliance of the acoustic system, e.g., a muffler, s is the Laplace variable, and L represents the inertance of the ports in the system. C and L are common acoustic parameters.

Depending on the frequency range of operation, the speaker (actuator) dynamics may need to be accounted for. This can be done by further augmenting the filter transfer function with the inverse of speaker transfer function. The transfer function of a well-designed speaker for the frequency range it is designed for, can be represented by $$SPK = \frac{Ks^2}{s^2 + 2\zeta_s \omega_s s + \omega_s^2}$$

where K is the gain, $\zeta_s$ is the damping ratio, $\omega_s$ is the natural frequency of the speaker, and s is the Laplace variable. This transfer function maps the voltage to the rate of change of volume velocity generated by the speaker. At higher frequencies, above about 150 Hz, it may also be necessary to account for the electrical dynamics of the acoustic actuator in addition to its mechanical dynamics. A convenient manner for accounting for the electrical dynamics of the actuator may be gleaned from the current feedback control schemes commonly employed in the design of servo-controlled motors. Essentially, the current in the actuator is fed back through the amplifier to account for the electrical dynamics of the actuator.

Cascading the transfer functions of Equations (4) and (5) with the inverse of speaker transfer function results in the transfer functions of Equations (6) and (7) for low-pass and high-pass filters.

$$LP = \frac{s^2 + 2\zeta_s \omega_s s + \omega_s^2}{K} \qquad (6)$$

$$HP = \frac{1}{LK} \frac{s^2 + 2\zeta_s \omega_s s + \omega_s^2}{s^2} \qquad (7)$$

The low-pass filter transfer function of Equation (6) is not rational (has more zeros than poles) and thus unrealizable. We modify this transfer function by augmenting it with a pair of fast poles, which are located far in the left half of the s-plane.

The high-pass filter transfer function of Equation (7) is rational, but its poles are located at the origin of the s-plane. In other words, it contains a double integrator which can make the realization unstable unless the correct initial conditions are used. Since the initial conditions are generally not known in filtering applications, the two poles at the origin are moved slightly to the left of the origin. In other words, the double integrator is replaced by a $2^{nd}$ order system. The added benefit of doing so is elimination of the possibility of saturating integrators in the controller by the DC offset of the microphone and the associated electronics.

The modifications to the LP and HP filters, described above, result in the transfer functions of both filters to have similar structure, as shown in Equations (8) and (9)

$$LP = \frac{C}{K} \frac{s^2 + 2\zeta_s \omega_s s + \omega_s^2}{s^2 + 2\zeta \omega s + \omega^2} \qquad (8)$$

$$HP = \frac{1}{LK} \frac{s^2 + 2\zeta_s \omega_s s + \omega_s^2}{s^2 + 2\zeta \omega s + \omega^2} \qquad (9)$$

where $\omega$ and $\zeta$ are the natural frequency and damping ratio corresponding to the added pair of fast poles. The main distinction between the two transfer functions of Equations (8) and (9) is the location of their poles. LP has poles located far to the left and HP has its poles located near the origin of the s-plane.

Comparison of the two transfer functions of LP and HP acoustic filters, i.e., Equations (8) and (9) with the transfer function of the "active feedback-controlled system" which can also be viewed as an active band-reject acoustic filter represented in Equation (3'), reveals that they are all similar. In other words, active implementation of LP, HP, and band-reject acoustic filters require the same control strategy (algorithm and hardware).

The two transfer functions of Equations (8) and (9) and the active feedback-controlled transfer function are rational, but not strictly rational. That is they do not have more poles than zeros (numerator and denominator have the same order). Although they are realizable, their frequency responses do not roll off at high frequencies jeopardizing the stability robustness of such realization. To enhance their robustness, we can add one more fast pole to such transfer functions.

In an illustrative numerical example, the proposed low- and high-pass active acoustic filtering techniques were demonstrated on a duct closed at one end and open at the other, with the length of 3 meters and diameter of 0.1 meter. The duct is disturbed by volume velocity input near the closed end.

Figure 13A:
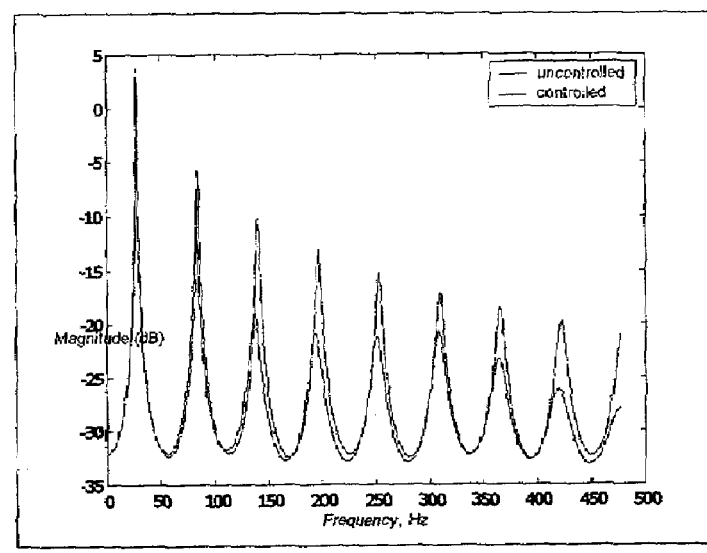
FIGS. 13(*a*) and 13(*b*) are plots of the frequency response functions of a duct equipped with active, low- and high-pass acoustic filters of the present invention.
Figure 13B:
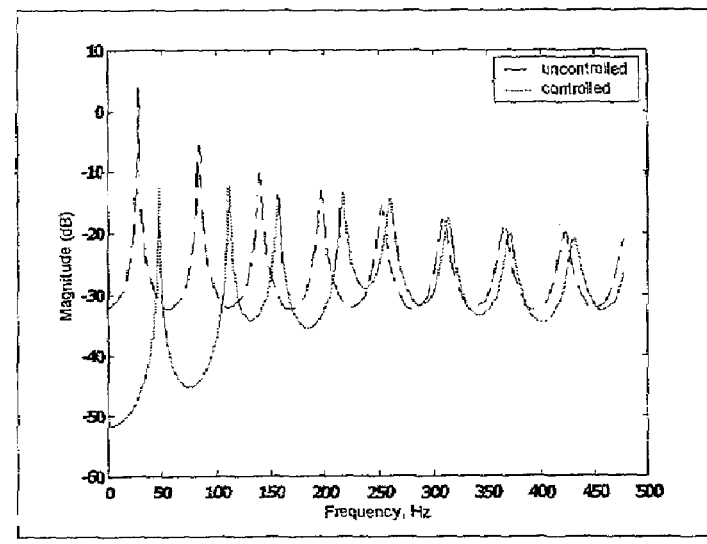

Using the resonant frequencies and the corresponding normalized mode shapes, the low-frequency model of the duct is formulated. This model is used to analyze the system and tune the filters for the duct. The solid line in FIGS. 13(a) and 13(b) depicts the magnitude of the frequency response functions of the duct evaluated using this model. This FRF maps the rate of change of a point volume velocity at the closed end of the duct to the pressure at the close vicinity of the open end of the duct. The dashed lines in FIGS. 13(a) and 13(b) show the same frequency responses for the duct equipped with an active low- (a) and high-pass (b) acoustic filters located close to the duct exit. As illustrated in FIGS. 13(a) and 13(b), both filters perform very effectively.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A system for actively damping low-frequency coloration of sound comprising:
a listening room including a sound source, said listening room defining at least one mode of low-frequency coloration attributable to said listening room;
an acoustic wave sensor positioned within said listening room, wherein said acoustic wave sensor is operative to produce a first signal representative of said at least one mode of low-frequency coloration;
an acoustic wave actuator responsive to a second signal and positioned within said listening room; and
an electronic feedback controller defining an input coupled to said first signal and an output, wherein
said electronic feedback controller is operative to generate said second signal at said output by applying a feedback controller transfer function to said first signal,
said feedback controller transfer function comprises a second order differential equation including a first variable representing a predetermined damping ratio and a second variable representing a tuned natural frequency,
said second variable representing said tuned natural frequency is selected to be tuned to said at least one mode of low-frequency coloration,
said feedback controller transfer function defines a frequency response having a characteristic maximum gain substantially corresponding to the value of said at least one mode of low-frequency coloration,
said feedback controller transfer function creates a 90 degree phase lead substantially at said at least one mode of low-frequency coloration,
said feedback controller transfer function is augmented by the inverse of an acoustic wave actuator transfer function of said acoustic wave actuator to produce an augmented feedback controller transfer function, and
said augmented feedback controller transfer function is as follows:

$$\frac{V(s)}{P(s)} = G \frac{s^2 + 2\zeta_s \omega_s s + \omega_s^2}{s^2 + 2\zeta \omega_n s + \omega_n^2}$$

where the units of V(s) corresponds to said rate of change of volume velocity, P(s) corresponds to the pressure at the location of said acoustic wave sensor and said acoustic wave actuator, s is the Laplace variable, $\zeta$ represents a damping ratio of an acoustic damping controller, $\zeta_s$ represents the damping ratio of said acoustic wave actuator, $\omega_n$ is said tuned natural frequency, $\omega_s$ represents the natural frequency of said acoustic wave actuator, and G is a gain value.

2. The system for actively damping the low-frequency coloration of sound as claimed in claim 1 wherein said first signal represents pressure sensed by said acoustic wave sensor and said second signal represents a rate of change of volume velocity to be produced by said acoustic wave actuator.

3. The system for actively damping the low-frequency coloration of sound as claimed in claim 1 wherein
said first signal represents pressure sensed by said acoustic wave sensor,
said second signal represents a rate of change of volume velocity to be produced by said acoustic wave actuator, and wherein
said feedback controller transfer function is as follows:

$$\frac{V(s)}{P(s)} = G \frac{s^2}{s^2 + 2\xi \omega_n s + \omega_n^2}.$$

where the units of V(s) corresponds to said rate of change of volume velocity, P(s) corresponds to the pressure at the location of said acoustic wave sensor and said acoustic wave actuator, s is the Laplace variable, $\xi$ is a damping ratio, $\omega_n$ is said tuned natural frequency, and G is a gain value.

4. The system for actively damping the low-frequency coloration of sound as claimed in claim 1 wherein
said first signal represents pressure sensed by said acoustic wave sensor,
said second signal represents a rate of change of volume velocity to be produced by said acoustic wave actuator.

5. The system for actively damping the low-frequency coloration of sound as claimed in claim 1 wherein said feedback controller transfer function defines a frequency response and wherein the gain of said frequency response increases substantially uniformly from a minimum frequency value to an intermediate frequency value to define a characteristic maximum gain and decreases substantially uniformly from said intermediate frequency value to a maximum frequency value.

6. The system for actively damping the low-frequency coloration of sound as claimed in claim 5 wherein said intermediate frequency value corresponds to said at least one mode of low-frequency coloration.

7. The system for actively damping the low-frequency coloration of sound as claimed in claim 1 wherein said first variable representing said predetermined damping ratio is a value between about 0.1 and about 0.35.

8. The system for actively damping the low-frequency coloration of sound as claimed in claim 1 wherein said first variable representing said predetermined damping ratio and said second variable representing said tuned natural frequency are selected to damp said at least one mode of low-frequency coloration.

9. The system for actively damping the low-frequency coloration of sound as claimed in claim 1 wherein said second variable representing said tuned natural frequency is selected to be substantially equivalent to a natural frequency of a target acoustic mode of said at least one mode of low-frequency coloration.

10. The system for actively damping the low-frequency coloration of sound as claimed in claim 9 wherein said target acoustic mode comprises the lowest frequency audible mode of low-frequency coloration.

11. The system for actively damping the low-frequency coloration of sound as claimed in claim 1 wherein said second variable representing said tuned natural frequency is selected to be a value between adjacent frequency modes.

12. The system for actively damping the low-frequency coloration of sound as claimed in claim 1 wherein said electronic feedback controller is further operative to invert the phase of said second signal.

13. The system for actively damping the low-frequency coloration of sound as claimed in claim 1 wherein said acoustic wave actuator introduces characteristic acoustic dynamics into said system and wherein said electronic feedback controller is operative to introduce inverse actuator dynamics into the system.

14. The system for actively damping the low-frequency coloration of sound as claimed in claim 1 wherein
  said electronic feedback controller comprises an acoustic damping controller programmed to apply said feedback controller transfer function, and wherein
  said acoustic damping controller is configured to selectively damp or treat greater than one frequency mode of coloration.

15. The system for actively damping the low-frequency coloration of sound as claimed in claim 14 wherein said acoustic damping controller is positioned within said listening room.

16. The system for actively damping the low-frequency coloration of sound as claimed in claim 1 wherein said first signal and said second signal comprise respective electric signals.

17. The system for actively damping the low-frequency coloration of sound as claimed in claim 1 wherein said acoustic wave actuator and said acoustic wave sensor are positioned to correspond to the location of an acoustic anti-node of a target acoustic mode within said listening room.

18. The system for actively damping the low-frequency coloration of sound as claimed in claim 1 wherein said acoustic wave sensor is a microphone.

19. The system for actively damping the low-frequency coloration of sound as claimed in claim 1 wherein said acoustic wave actuator is a subwoofer.

20. A system for actively damping the low-frequency coloration of sound comprising:
  a listening room including a sound source, said listening room defining at least one mode of low-frequency coloration attributable to said sound source;
  an acoustic wave sensor positioned within said listening room, wherein said acoustic wave sensor is operative to produce a first signal representative of said at least one mode of low-frequency coloration, and wherein said first signal represents pressure sensed by said acoustic wave sensor;
  an acoustic wave actuator responsive to a second signal and positioned within said listening room, wherein said acoustic wave actuator is substantially collocated with said acoustic wave sensor, wherein said second signal represents a rate of change of volume velocity to be produced by said acoustic wave actuator, and wherein said acoustic wave actuator introduces acoustic dynamics into said system; and
  an electronic feedback controller defining an input coupled to said first signal and an output, wherein
    said electronic feedback controller is operative to generate said second signal at said output by applying a feedback controller transfer function to said first signal, invert the phase of said second signal, and to introduce inverted actuator acoustic dynamics into said second signal,
    said feedback controller transfer function comprises a second order differential equation including a first variable representing a predetermined damping ratio and a second variable representing a tuned natural frequency,
    said second variable representing said tuned natural frequency is selected to be tuned to said at least one mode of low-frequency coloration, and wherein
    said feedback controller transfer function is as follows $$\frac{V(s)}{P(s)} = G\frac{s^2}{s^2 + 2\xi\omega_n s + \omega_n^2},$$

where the units of V(s) corresponds to said rate of change of volume velocity, P(s) corresponds to the pressure at the location of said acoustic wave actuator and said acoustic wave sensor, $\xi$ is a damping ratio, $\omega_n$ is said tuned natural frequency, and G is a gain value,
  said feedback controller transfer function defines a frequency response having a characteristic maximum gain substantially corresponding to the value of said at least one mode of low-frequency coloration,
  said feedback controller transfer function creates a 90 degree phase lead substantially at said at least one mode of low-frequency coloration,
  said intermediate frequency value corresponds to said at least one mode of low-frequency coloration, and
  said feedback controller transfer function is augmented by the inverse of an acoustic wave actuator transfer function of said acoustic wave actuator to produce an augmented feedback controller transfer function, and
  said augmented feedback controller transfer function is as follows:

$$\frac{V(s)}{P(s)} = G\frac{s^2 + 2\zeta_s\omega_s s + \omega_s^2}{s^2 + 2\zeta\omega_n s + \omega_n^2}$$

where the units of V(s) corresponds to said rate of change of volume velocity, P(s) corresponds to the pressure at the location of said acoustic wave sensor and said acoustic wave actuator, s is the Laplace variable, $\zeta$ represents a damping ratio of an acoustic damping controller, $\zeta_s$ represents a damping ratio of said acoustic wave actuator, $\omega_n$ is said tuned natural frequency, $\omega_s$ represents the natural frequency of said acoustic wave actuator, and G is a gain value.

* * * * *